(12) United States Patent
Delperier et al.

(10) Patent No.: US 8,847,128 B2
(45) Date of Patent: Sep. 30, 2014

(54) HEAT TREATMENT OVEN WITH INDUCTIVE HEATING

(75) Inventors: Bernard Delperier, Merignac (FR); Yvan Baudry, Bordeaux (FR); Olivier Petitjean, Saint Laurent d'Agny (FR)

(73) Assignee: Messier-Bugatti-Dowty, Velizy-Villacoublay (FR)

( * ) Notice: Subject to any disclaimer, the term of this patent is extended or adjusted under 35 U.S.C. 154(b) by 1129 days.

(21) Appl. No.: 12/425,713

(22) Filed: Apr. 17, 2009

(65) Prior Publication Data

US 2009/0261090 A1 Oct. 22, 2009

(30) Foreign Application Priority Data

Apr. 18, 2008 (FR) ...................................... 08 52641

(51) Int. Cl.
*H05B 6/10* (2006.01)
*C23C 16/452* (2006.01)
*C23C 16/04* (2006.01)

(52) U.S. Cl.
CPC .............. *C23C 16/045* (2013.01); *C23C 16/452* (2013.01)
USPC .......................................................... 219/634

(58) Field of Classification Search
USPC .......... 219/209, 390, 399, 405; 432/120, 159, 432/241, 247; 438/660, 663, 715; 118/50.1, 118/724, 725, 726, 732; 177/245, 248.1; 427/249.2, 249.1, 255.12, 255.7, 900
See application file for complete search history.

(56) References Cited

U.S. PATENT DOCUMENTS

| | | | | |
|---|---|---|---|---|
| 4,579,080 | A * | 4/1986 | Martin et al. | 118/500 |
| 6,572,371 | B1 * | 6/2003 | Sion et al. | 432/247 |
| 2006/0068679 | A1 * | 3/2006 | Bewlay et al. | 445/26 |
| 2006/0118048 | A1 * | 6/2006 | Maccalli et al. | 118/728 |

* cited by examiner

*Primary Examiner* — Thien S Tran
(74) *Attorney, Agent, or Firm* — Preti Flaherty Beliveau & Pachios LLP (57) ABSTRACT

The invention relates to a heat treatment oven comprising a loading or treatment zone, at least one gas inlet, a gas preheater chamber situated in the oven between the gas inlet and the loading or treatment zone, a susceptor comprising at least a side wall surrounding the preheater chamber and the loading or treatment zone, and a field winding suitable for heating the side wall by induction. The portion of the side wall of the susceptor that is situated around the preheater chamber presents at least two recesses spaced apart circumferentially from one another so as to form portions of reduced thickness in said portion of the side wall.

13 Claims, 6 Drawing Sheets

HEAT TREATMENT OVEN WITH INDUCTIVE HEATING

BACKGROUND OF THE INVENTION

The invention relates to inductively-heated ovens or installations used for performing heat treatment, and in which the gas used in the treatment is preheated prior to being introduced into the treatment chamber of the oven. Such ovens are used in particular for performing thermochemical treatments such as carburizing parts or densifying porous substrates by chemical vapor infiltration.

The field of application of the invention is that of making parts out of composite material that is thermostructural, i.e. material that presents both mechanical properties making it suitable for constituting structural parts, and the ability to conserve those properties up to high temperatures. Typical examples of thermostructural composite materials are carbon/carbon (C/C) composites having a carbon fiber reinforcing texture that is densified by a pyrolytic carbon matrix, and ceramic matrix composites (CMCs) having a refractory fiber reinforcing texture (made of carbon or of ceramic) that is densified by a ceramic matrix.

A well-known process for densifying porous substrates to make C/C or CMC composite parts is chemical vapor infiltration (CVI). The substrates for densifying are placed in a loading zone of a furnace or oven where they are heated. A reactive gas containing one or more gaseous precursors for the material constituting the matrix is introduced into the oven. The temperature and the pressure inside the oven are controlled so as to enable the reactive gas to diffuse within the pores of the substrates and form therein a deposit of the matrix-constituting material by decomposing one or more constituents of the reactive gas or by chemical reaction between a plurality of constituents, where the constituents form the precursor of the matrix. The process is performed under low pressure so as to encourage diffusion of the reactive gas into the substrates. The temperature at which the precursor(s) are transformed so as to form the material of the matrix, such as pyrolytic carbon or a ceramic, is generally higher than 900° C., and is typically close to 1000° C.

In order to ensure that densification of the substrates takes place throughout the loading zone of the oven as uniformly as possible, both in terms of the increase in density and in terms of the microstructure of the matrix material that is formed, it is necessary for the temperature in the loading zone to be substantially uniform.

Thus, ovens usually include a preheater chamber or zone for preheating the reactive gas and situated between the inlet for reactive gas into the oven and the loading zone. Typically, the preheater zone comprises a plurality of perforated plates through which the reactive gas passes.

The plates for preheating the gas, like the substrates, are heated because of their presence in the oven. The oven itself is generally heated by means of an induction secondary known as a "susceptor", e.g. made of graphite, that defines the side wall of the oven and that is coupled to a field winding or "induction coil" surrounding the oven. In accordance with the well-known principle of induction heating, when the susceptor is placed in a varying magnetic field that is generated by current flowing in the induction coil, an induced current flows in the susceptor, which induced current "reflects" the inducing current. The induced current flow in the susceptor causes it to be heated by the Joule effect. The heat as dissipated in this way is transmitted by radiation into the oven enclosure as defined by the susceptor.

With ovens of large dimensions (large diameters), the Applicant has observed that the loaded substrates are subject to substantial temperature variations. A significant example is that of isothermal chemical vapor infiltration (ICVI) of substrates, where the substrates are constituted by annular preforms of carbon fibers or by predensified annular blanks, for the purpose of making C/C composite brake disks. The substrates are placed in one or more vertical stacks in the loading zone, above the reactive gas preheater chamber that is situated in the bottom portion of the oven. It is important to minimize variations of the reactive gas temperature during densification to reduce densification non-uniformities and avoid generation of undesired species. Unfortunately, with a preheater chamber of the kind described above, substantial temperature variations have been observed.

In general, for any heat treatment oven having a gas preheater chamber, it is desirable for the preheating of the gas at the outlet from such a chamber to allow for an efficient thermal control all along the heat treatment.

In order to solve this problem, it might be envisaged that the effectiveness with which the gas is preheated might be increased by enlarging the heater zone, in particular by increasing its volume heightwise to the detriment of the volume of the loading zone, for given total oven volume. However, treatments such as the chemical vapor infiltration process requires a large amount of investment on an industrial scale, and the treatment can take a very long time to perform. It is therefore highly desirable for ovens to present high levels of productivity, regardless of whether the ovens are already in service or are new ovens to be made, and therefore it is desirable for the working volume dedicated to loading substrates or parts for treatment to be as great as possible in comparison with the volume dedicated to heating the reactive gas.

OBJECT AND SUMMARY OF THE INVENTION

An object of the invention is to provide a design of heat treatment oven that enables the effectiveness of the preheating to be increased without requiring a large volume for the gas heater zone, hence without degrading the productivity of the oven, and possibly even improving it.

To this end, the present invention proposes a heat treatment oven comprising a loading or treatment zone, at least one gas inlet, a gas preheater chamber situated in the oven between the gas inlet and the loading or treatment zone, a susceptor comprising at least a side wall surrounding the preheater chamber and the loading or treatment zone, and a field winding suitable for heating the side wall by induction, in which oven, in accordance with the invention, the portion of the side wall of the susceptor that is situated around the preheater chamber presents at least two recesses spaced apart circumferentially from one another so as to form portions of reduced thickness in said portion of the side wall.

By using a susceptor having its side wall around the preheater chamber presenting portions of reduced thickness where the recesses are located, localized heating zones are created (isolated temperature peaks).

By means of these isolated temperature peaks, the overall temperature within the preheater chamber is also increased. This improves the effectiveness of the preheater chamber in terms of gross calorific value, and this is done without having recourse to an increase in its volume that would decrease the loading capacity of the oven.

In accordance with the invention, the portion of the susceptor that includes recesses is situated level with the preheater chamber so as to avoid creating hot spots in the loading zone since, when applying heat treatment to densifying porous substrates, that would lead to accelerated densification of substrates close to the hot spots compared with densification of other substrates further away.

The recesses may be formed in the inner periphery or the outer periphery of the side wall of the susceptor. The recesses preferably open to the outside of the bushing. The recesses are preferably regularly spaced apart from one another so as to obtain a good distribution for the heat emitted from the portions of reduced thickness. For example when the portion of the susceptor side wall has three recesses, they are spaced apart at 120° from one another. The recesses may also be filled with a material that is electrically and thermally insulating, such as alumina.

The recesses are preferably of a height that is less than the height of the preheater chamber and of the load support so as to localize the portions of reduced thickness level with the preheater chamber and thus avoid generating hot spots in the loading zone since that could locally disturb the kinetics of deposition in the substrates.

According to an aspect of the invention, the side wall of the susceptor is segmented into at least two bushings: a bottom bushing including the recesses and a top bushing mainly surrounding the loading or treatment zone. The portion of the side wall of the susceptor including the recesses can thus be made independently from the remainder of the wall.

In another particular aspect of the invention, the bottom bushing forms the side wall of the preheater chamber and includes a shoulder for supporting the top plate of the preheater chamber.

According to yet another particular aspect of the invention, the bottom bushing may be decoupled from the preheater chamber.

The inductor is driven by an alternating voltage generator operating at a frequency that lies in the range 50 hertz (Hz) to 1000 Hz, approximately.

BRIEF DESCRIPTION OF THE DRAWINGS

Other features and advantages of the densification oven of the invention appear on reading the following description made by way of non-limiting indication and with reference to the accompanying drawings, in which.

DETAILED DESCRIPTION OF EMBODIMENTS

The invention applies to any type of inductively-heated oven or installation that is used for performing heat treatment and in which the gas used in the treatment is preheated in a preheater chamber prior to being introduced into the treatment or loading zone of the oven. Such ovens are used in particular for performing thermochemical treatment, such as carburizing parts or densifying porous substrates by chemical vapor infiltration.

Embodiments of the oven in accordance with the invention are described below in the context of an application to densifying annular porous substrates constituted by carbon fiber preforms or by predensified blanks that are for use in making brake disks out of C/C composite material. Such disks are commonly used for airplane wheels and for racing cars.

Figure 1:
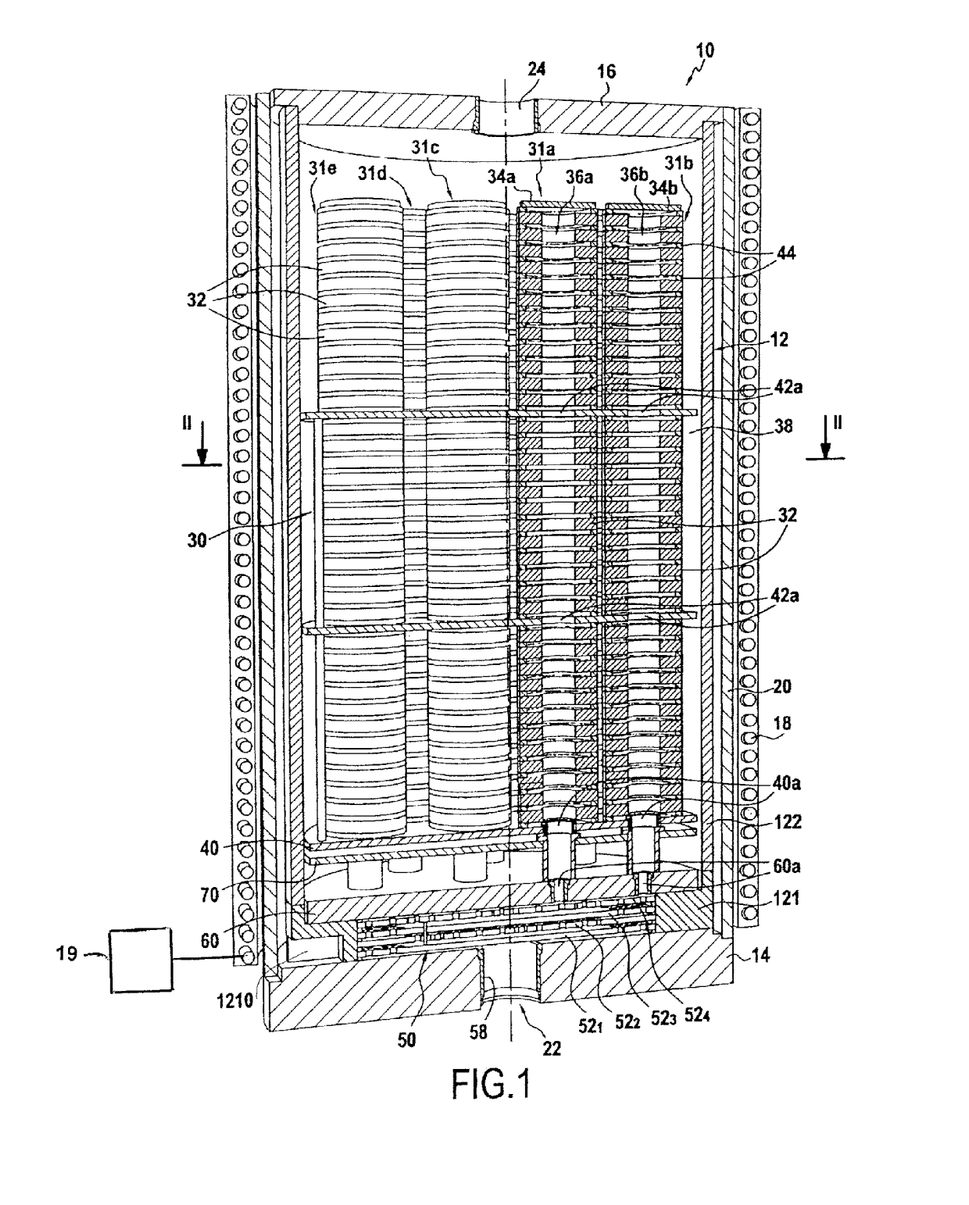
FIG. 1 is a diagrammatic section view of an embodiment of a densification oven in accordance with the invention.

A first embodiment of a densification oven is described with reference to FIGS. 1 to 3. FIG. 1 is a diagram showing an oven 10 defined by a cylindrical side wall 12, a bottom wall 14, and a top wall 16.

A gas preheater chamber 50 extends between the bottom 14 of the oven and a gas distribution plate 60. In well-known manner, the preheater chamber 50 comprises a plurality of perforated plates $52_1$ to $52_4$, e.g. made of graphite, that are disposed one above another and that are held spaced apart from one another by spacer studs 28 and annular spacers 29 likewise made of graphite, for example (FIG. 3). A duct 58 connects the reactive gas inlet 22 to the preheater chamber 50 through the bottom 14.

The substrates 32 for densifying are disposed in a loading zone 30 (or reaction chamber) in a plurality of vertical annular stacks 31a to 31l (FIG. 2) standing on a load support plate 40. The plate includes a plurality of passages 40a in alignment with the inside volumes 36a to 36l of the stacks, and each stack is closed at its top end by a cover such as 34a or 34b. The gas distribution plate has a plurality of passages 60a in alignment with the passages 40a and the inside volumes 36a to 36l (FIG. 3). The passages 60a are connected to the passages 40a by bushings or chimneys 61 that open out into openings 70a in a holder plate 70 that are in alignment with the openings 40a. Rings 84 are also placed between the tops of the chimneys 61 and the openings 40a. The plate 70 supports the loading plate 40 via studs 86. Similarly, the plate 70 is supported by the gas distribution plate 60 via studs 62.

The stacks 31a to 31l of substrates rest on the load support plate 40 and they may be subdivided into a plurality of superposed sections that are separated by one or more intermediate plates 42 having central passages 42a in alignment with those of the substrates 32. Each substrate 32 is separated from an adjacent substrate, or where appropriate from a plate 40, 42 or the cover 34, by spacers 44 that define gaps 46. The spacers 44, or at least some of them, are arranged to leave passages for the gas between the volumes 36a to 36l and 38. These passages may be made in such a manner as to bring the pressure between the volumes 36 and 38 substantially into balance, as described in U.S. Pat. No. 5,904,957, or in such a manner as to constitute mere leakage passages that maintain a pressure gradient between the volumes 36 and 38, as described in U.S. Pat. No. 7,182,980.

The reactive gas admitted into the oven through the opening 22 passes through the preheater chamber 50 flowing through the multiple perforations in the plate 52. The preheated gas is then conveyed by the passages 60a and the chimneys 61 and reaches the internal volumes 36a to 36l of the stacks through the passages such as 40a and 40b of the plate 40. The gas then passes into the volume 38 outside the stacks and inside the loading zone 30. The effluent gas is extracted via a passage 24 formed through the top wall 16, the passage 24 being connected by a pipe to suction means, such as a suction pump (not shown).

Figure 2:
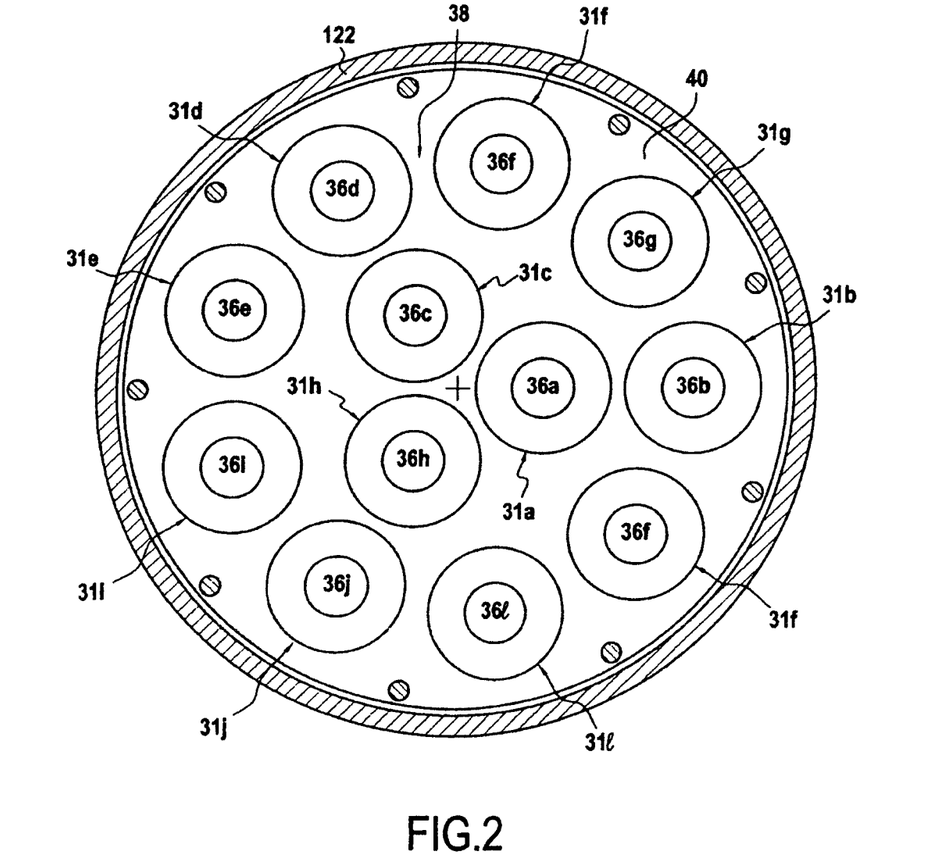
FIG. 2 is a section view of the FIG. 1 oven on plane II-II.

Although twelve stacks are shown in FIG. 2, the number of stacks could naturally be greater or smaller.

In a variant embodiment, the internal volumes 36a to 36l may be closed at their bottom portions and put into communication with the passage 24 via their top portions. The reagent gas coming from the preheater chamber 50 would then be admitted into the volume 38 of the loading zone and gas would flow in said zone from the volume 38 towards the volume 36a to 36l, the volume 38 being closed at its top end.

In yet another variant, the reactive gas inlet may be made through the top wall 16 of the oven, with the preheater zone then being situated in the top portion of the oven, the volumes 36a to 36l then being in communication with the preheater zone and closed at their bottom portions while the volume 38 communicates with a gas outlet formed through the bottom wall of the oven, or vice versa.

In order to form a pyrolytic carbon matrix, the reactive gas contains one or more carbon precursors such as hydrocarbons. Chemical vapor infiltration is performed at a temperature that is generally higher than 90° C., e.g. lying in the range 950° C. to 1100° C., and under low pressure, e.g. less than 0.1 kilopascals (kPa).

The cylindrical side wall 12 constitutes an induction secondary or "susceptor", e.g. made of graphite, that is coupled with an inductor primary or field winding 18 situated outside the oven and formed by at least one induction coil. Insulation 20 is interposed between the field winding 18 and the wall 12. In well-known manner, the oven is heated by the susceptor 12 being heated when the winding 18 is powered with an alternating current (AC) voltage. For this purpose, the coil(s) of the field winding are connected to an AC voltage generator 19.

The magnetic field created by the winding 18 induces electric current in the wall 12 (susceptor), thereby heating it by the Joule effect. The temperature reached while induced current is flowing then depends directly on the flow section available for passing the current.

The power dissipated in a conductor can be expressed using the following equation:

$$P=RI^2$$

where:
P=dissipated power;
R=resistance of the conductor; and
I=current flowing in the conductor.

Furthermore, the resistance of a conductor is calculated using the following equation:

$$R=\rho L/S$$

where:
R=resistance in ohms ($\Omega$);
$\rho$=resistivity in microohm-meters ($\mu\Omega \cdot m$);
L=length in meters (m); and
S=section in square millimeters ($mm^2$).

Consequently, a narrowing in the flow section for the induced current leads to an increase in the dissipated power, and thus to an increase in the temperature to which the conductor is raised.

Resistance, and consequently dissipated power, can be further increased when the narrowing of the susceptor wall leads to an increase in the size of the airgap.

In accordance with the invention, the part of the side wall 12 that surrounds the preheater chamber 50 includes portions of reduced section in order to create localized hot spots in this level of the oven.

Figure 3:
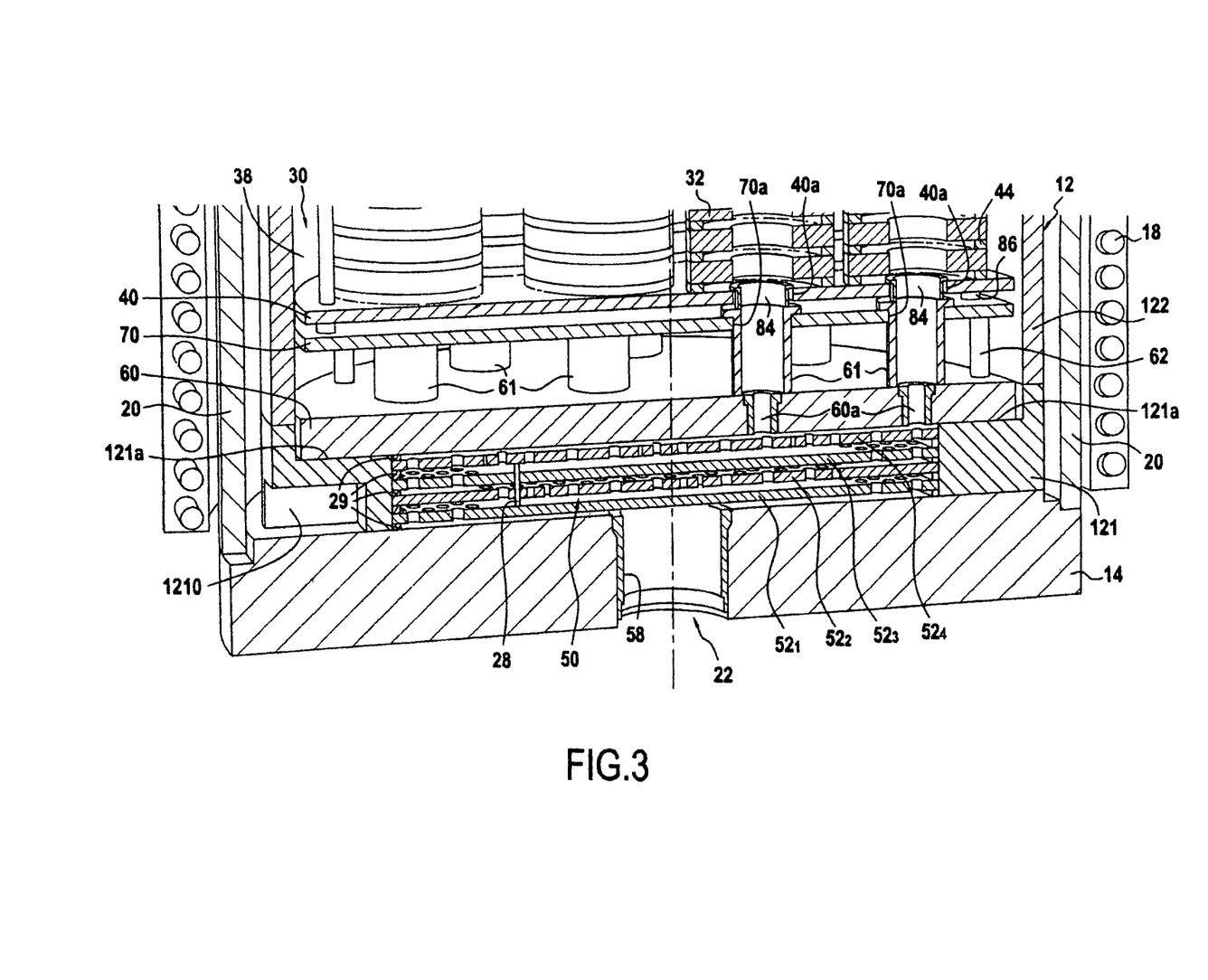
FIG. 3 is an enlarged view of the bottom portion of the FIG. 1 oven.
Figure 4:
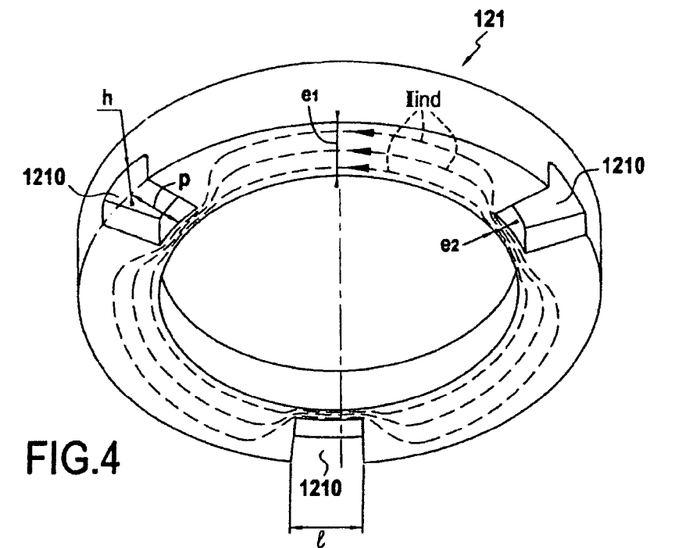
FIG. 4 is a perspective view of the bottom bushing of the susceptor of the FIG. 1 oven.

More precisely, as shown in FIGS. 1 and 3, the side wall 12 is made of at least two parts, namely a top bushing 122 having a wall that presents uniform thickness, and a bottom bushing 121 that includes three recesses 1210 distributed uniformly around the outer periphery of the bushing 121. As shown in FIG. 4, each recess 1210 forms, in the bottom bushing 121, a wall portion that presents a thickness $e_2$ that is less than the thickness $e_1$ of the remainder of the wall of the bushing.

The recesses 1210 present a height h that, generally speaking, is at least a little smaller than the height of the preheater chamber so as to avoid creating hot spots in the loading zone that would harm the uniformity with which the substrates are densified.

The depth p of the recesses, which defines the desired reduction in wall thickness, is a function of the localized higher temperature ("superheating") that it is desired to obtain in the reduced-thickness portions. As shown in FIG. 4, the induced current $I_{ind}$ that flows through the bottom bushing 121 of the susceptor has a flow section that is smaller at the recesses 1210 since in these locations the wall of the bottom bushing 121 presents a thickness $e_2$ that is less than the thickness $e_1$ of the remainder of the wall. Current flow in these smaller flow sections creates heating by the Joule effect that is greater than the heating created in the other portions of the bottom bushing 121. The more the thickness $e_2$ is reduced (i.e. the greater the depth p of the recesses), the greater the localized heating effect. Nevertheless, the extent to which the thickness of the wall can be reduced in the recesses 1210 is limited to a thickness beyond which the material of the bottom bushing 121 would become mechanically too weak. The thickness $e_2$ preferably corresponds to a thickness lying in the range 30% to 60% of the thickness $e_1$ of the remainder of the wall.

The recesses 1210 also present a width l that is determined as a function of the length of the reduced section current flow passage (length of the localized heating zone) that it is desired to obtain. Nevertheless, the width l must also be large enough to avoid any risk of electric arcs forming between the side edges of the recesses 1210, since arcs would eliminate the heating effect by enabling a fraction of the induced current to flow around the portion of reduced section. By way of example, the recesses 1210 may present a width l of at least about 15 centimeters (cm) if that is compatible with the breakdown voltage. The minimum width of the recesses is determined as a function of the pressure of the gas used in the oven. According to Paschen's law, the lower the pressure, the greater the risk of an electric arc appearing at a given breakdown voltage. The three recesses 1210 occupy a fraction of the periphery of the bushing lying substantially in the range 20% to 30%.

In this embodiment, the bottom bushing 121 presents a shoulder 121a on its inside periphery (FIG. 3), which shoulder forms a base on which the gas distribution plate 60 rests.

Temperature measurements have been carried out to show the effects produced when the bushing of the susceptor includes recesses in accordance with the present invention. These measurements were performed in an oven similar to that described above with reference to FIGS. 1 to 4, i.e. an oven in which the bottom bushing of the susceptor has three recesses that are uniformly distributed (at 120° to one another) around the outer periphery of the bottom bushing. The bottom bushing of the susceptor presents an outside diameter of 4190 mm and an inside diameter of 3830 millimeters (mm) above the shoulder and of 2980 mm below the shoulder. Each of the three recesses presents a height of 238 mm, a depth of 212 mm, and a width of 200 mm.

Figure 6:
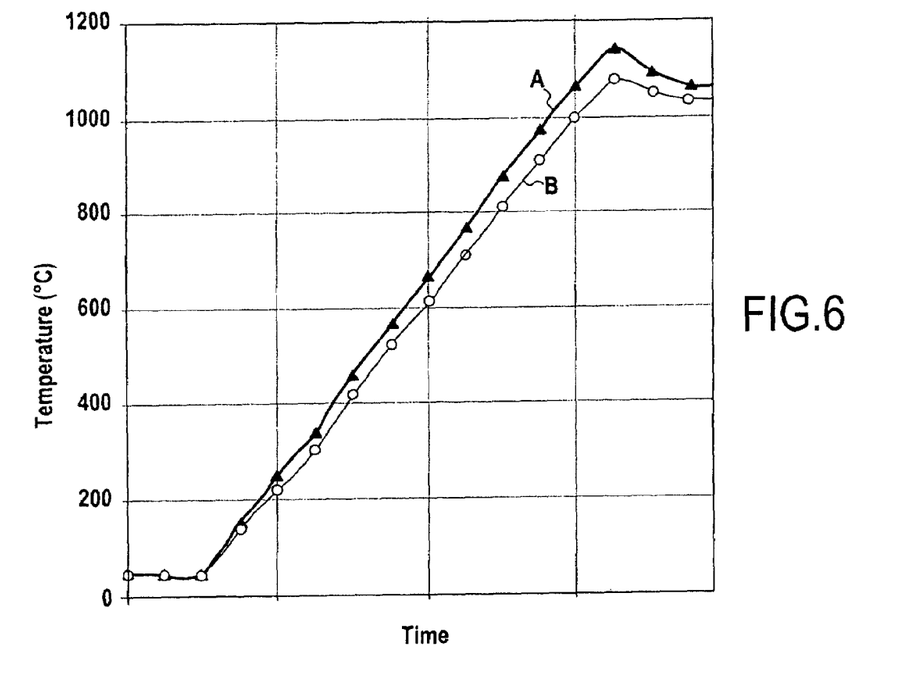
FIG. 6 is a graph plotting temperature variation respectively in the vicinity of and opposite from a recess in the bottom bushing of the susceptor.

FIG. 6 shows how temperature varies while heating the oven. Curve A shows the temperature measured with a temperature probe situated at 380 mm from the base of the susceptor above a recess, while curve B shows the temperature measured with a temperature probe likewise situated at 380 mm from the base of the susceptor, but in a portion opposite from a recess. It can be seen that while the oven is being heated up, the temperature is greater in the vicinity of the recesses than it is in other portions of the bushing. This demonstrates the capacity of the recesses for creating localized heating zones under the effect of induction.

The table below shows the temperatures measured during a CVI cycle both in a prior art oven, i.e. using a susceptor having a wall that does not include recesses, and in an oven in accordance with the invention, i.e. an oven having a susceptor in which the bottom bushing includes three recesses as described above. Both ovens present similar dimensions and they were loaded identically, i.e. with preforms placed in vertical annular stacks as described above with reference to FIGS. 1 and 2. CVI was performed in each of the ovens under identical conditions (same conditions of pressure, flow rate, and composition of the gas, and the field winding receiving same power supply (in terms of amplitude and frequency)).

| | Oven with susceptor bushing without recesses | | | Oven with susceptor bushing with recesses | | |
|---|---|---|---|---|---|---|
| | CVI cycle | | | | | |
| | Start | Middle | End | Start | Middle | End |
| Susceptor temp. (° C.) | 1088 | 1084 | 1085 | 1056 | 1042 | 1033 |
| Load temp., side stack (° C.) | 951 | 972 | 998 | 1000 | 1009 | 1010 |
| Center temp., stack bottom(° C.) | 927 | 948 | 977 | 945 | 960 | 978 |

The temperature measurements given in the above table show that in an oven using a susceptor with recesses in accordance with the invention, and using a susceptor temperature that is lower than in a prior art oven, a temperature is obtained that is higher overall and more uniform in the loads throughout the infiltration cycle.

The two CVI cycles are quite comparable to each other since the temperature at the center stack bottom is substantially the same at the end of the densification (977° C. and 978° C.).

The temperature variation between the beginning and the end of the densification is substantially lower with the invention, namely a variation of 33° C. instead of 47° C. at the center stack bottom and a variation of 10° C. instead of 47° C. for a side stack.

In addition, overheating of the susceptor is avoided, the overall temperature of the susceptor being about 1400° C. Thus, a risk of modification of the nature of the pyrolytic carbon deposited is reduced, in particular the risk of generating undesirable deposits (soots), and the thermal load on the susceptor is reduced which allows its life time to be increased.

The general thermal efficiency of the oven is thus improved, and this is even shown by the temperature at the center stack bottom which is of 943° C. instead of 927° C. at the beginning of the densification.

Figure 5:
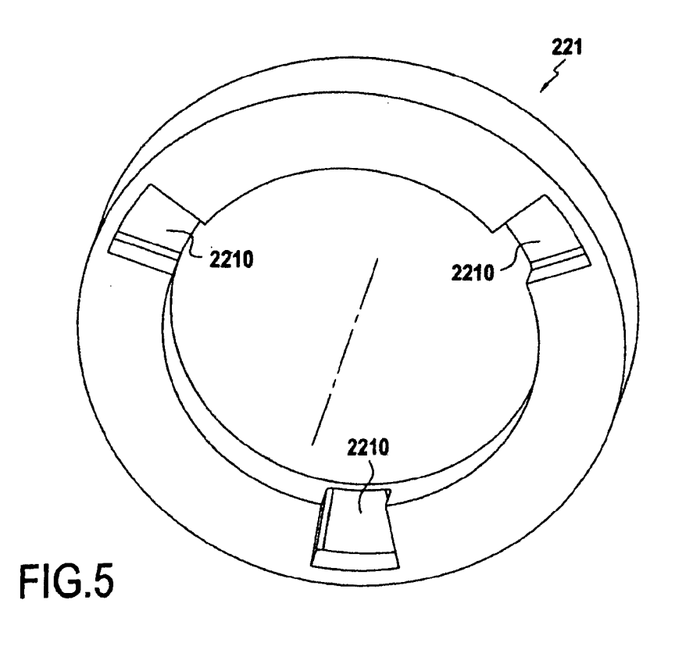
FIG. 5 is a perspective view of a variant embodiment of the FIG. 4 bottom bushing.

In a variant embodiment of the invention, shown in FIG. 5, the susceptor may include a bottom bushing 221 with recesses 2210 formed in the inner periphery of the bushing.

Figure 7:
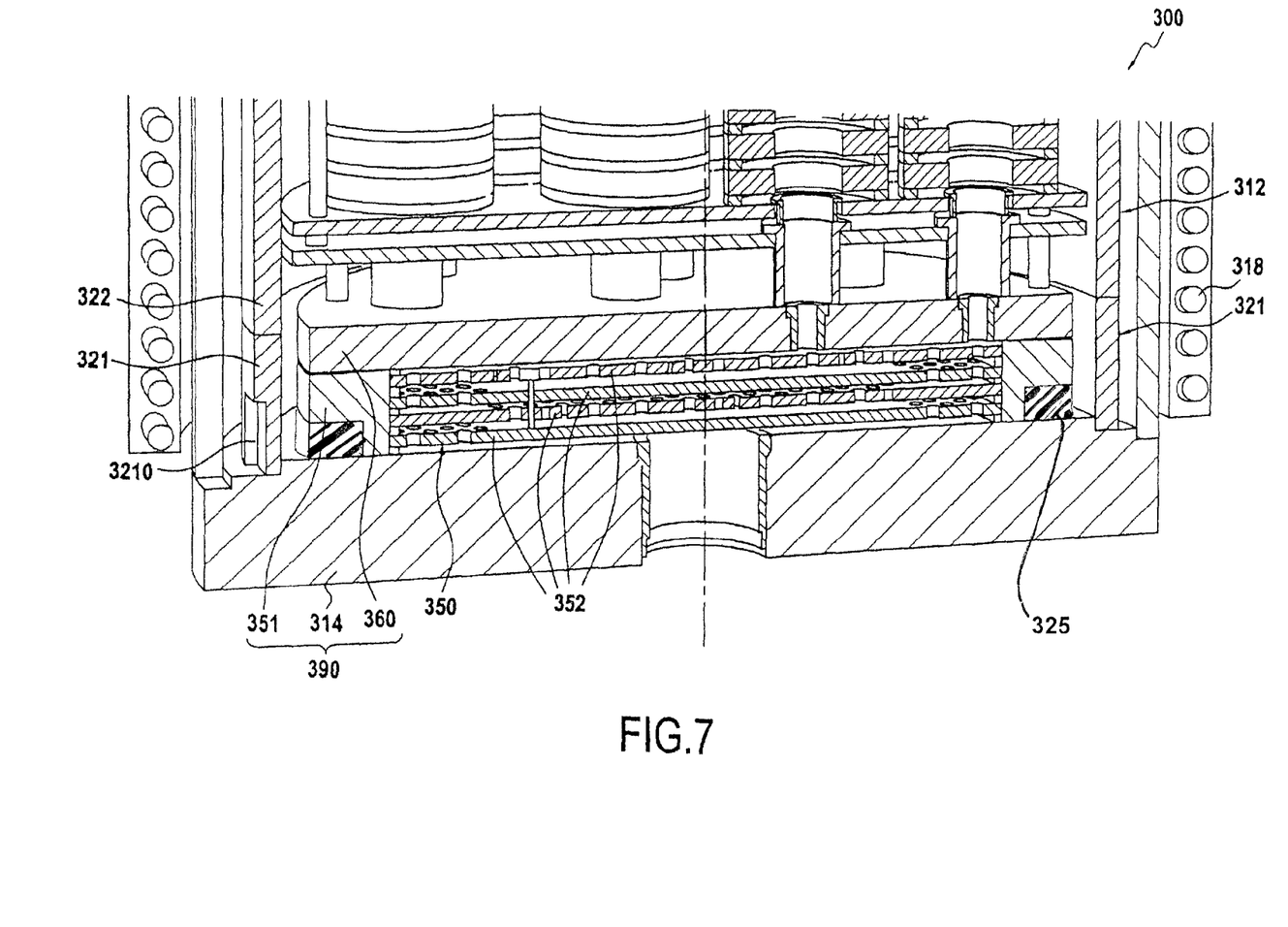
FIG. 7 is an enlarged view of the bottom portion of another embodiment of a densification oven in accordance with the invention.

FIG. 7 shows another variant embodiment of the densification oven 300 that differs from that of FIG. 1 in that the bottom bushing 321 is mechanically decoupled from the preheater chamber 350. In this embodiment, the preheater chamber 350 is formed by a box 390 defined by a side wall 351, the bottom wall 314 of the oven, and the gas distribution plate 360. The perforated plates 352 are housed in the box formed in this way.

Figure 8:
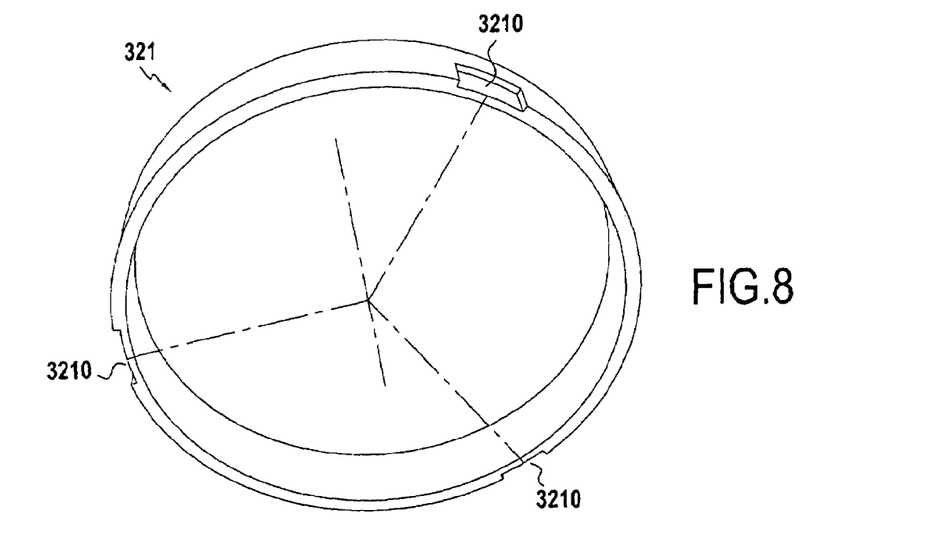
FIG. 8 is a perspective view of the bottom bushing of the susceptor of the FIG. 7 oven.

The cylindrical side wall 312 constituting the susceptor of the oven 300 and coupled with a coil 318 is made up of at least two parts, a top bushing 322 having a wall that presents uniform thickness, and a bottom bushing 321. As shown in FIG. 8, the bottom bushing 321 includes, like the above-described bottom bushing 121, three recesses 3210 that are uniformly distributed around the outer periphery of the bushing 321 and that form in the bottom bushing 321 a wall portion that presents thickness that is smaller than the thickness of the wall of the remainder of the bushing. The recesses may also be provided in the internal periphery of the bushing.

The height, the depth, and the width of the recesses are functions of the criteria described above. The recesses may also be provided in the inner periphery of the bushing 321.

The other elements of the oven 300 are identical to those described above with reference to the oven 10 and they are not described here again, for reasons of simplification.

In an aspect of the invention, the recesses may be filled with a non-conductive material 325 so as to reinforce the bushing mechanically in the recesses. Furthermore, the filler material used is preferably a thermal insulator in order to avoid radiating heat outwards from the enclosure of the oven. By way of example, such a material may be alumina.

The localized heating effect produced by the recesses in the bottom bushing of the susceptor is of effectiveness that increases with reducing driving frequency. The induction coil is powered by a generator with an alternating voltage at a frequency lying in the range 50 Hz to 1000 Hz, e.g. 850 Hz.

Finally, it should be observed that the field of application of the invention is not in any way limited to making C/C composite brake disks, but also extends to making other C/C composite parts, for example the diverging portions of rocket engine nozzles, as described in particular in above-mentioned U.S. Pat. No. 5,904,957. More generally, the invention can be implemented for making parts out of any type of thermostructural composite material, i.e. not only C/C composites, but also CMCs. With CMCs, the composition of the reactive gas is selected as a function of the particular nature of the ceramic matrix. Gaseous precursors for ceramic matrices are well known, e.g. methyltrichlorosilane (MTS) and hydrogen gas ($H_2$) for forming a silicon carbide matrix. Reference can be made to patent FR 2 401 888 which describes methods of forming various ceramic matrices.

For heat treatments other than those serving to densify porous substrates, e.g. for carburizing, the person skilled in the art will have no difficulty in implementing the present invention by using and adapting the above-described bushing 121 to match the size and the shape of the oven under consideration.

What is claimed is:
1. A heat treatment oven comprising:
a loading or treatment zone having a longitudinally extending axis,
at least one gas inlet,
a gas preheater chamber situated in the oven between the gas inlet and the loading or treatment zone, above or below and in axial alignment along the axis with the loading or treatment zone, the gas preheater chamber having an axial height,
a susceptor comprising at least a side wall circumferentially surrounding the preheater chamber and the loading or treatment zone, a field winding suitable for heating the side wall by induction, and a gas distribution plate interposed between and separating the gas preheater chamber and the loading or treatment zone, the gas distribution plate extending transversely to the axis;

wherein the side wall of the susceptor terminates in an end portion having a ring that is situated around the preheater chamber, the ring comprising at least two recesses spaced apart circumferentially from one another so as to form portions of reduced thickness in said ring adjacent said preheater chamber, the recesses having an axially extending height less than the axial height of the gas preheater chamber and a radial dimension less than a thickness of said ring in a direction orthogonal to said axis.

2. An oven according to claim 1, wherein the ring situated around the preheater chamber includes three recesses spaced apart uniformly from one another.

3. An oven according to claim 1, wherein the recesses are formed in the inner or outer periphery of the ring.

4. An oven according to claim 1, wherein the recesses are regularly spaced apart from one another.

5. An oven according to claim 1, wherein the ring recesses have the axial dimension in the range of 30% to 60% of a radial thickness of the side wall.

6. An oven according to claim 1, wherein the axial height of the recesses is less than the axial height of the preheater chamber.

7. An oven according to claim 1, wherein the recesses have a width of at least 15 cm.

8. An oven according to claim 1, wherein the side wall of the susceptor is made up of at least a top bushing surrounding the loading zone, and a bottom bushing surrounding the preheater chamber, the bottom bushing including said ring portion and recesses.

9. An oven according to claim 8, wherein the bottom bushing confronts the side wall of the preheater chamber, and wherein said bottom bushing includes a shoulder for supporting the top plate of the preheater chamber.

10. An oven according to claim 1, wherein the side wall of the susceptor is made of graphite.

11. An oven according to claim 1, wherein the recesses are filled with an electrically insulating material.

12. An oven according to claim 11, wherein the material is also thermally insulating.

13. An oven according to claim 1, wherein the field winding is connected to an alternating voltage generator having a frequency lying in the range 50 Hz to 1000 Hz.

* * * * *